US012699148B2

(12) United States Patent
Vidal et al.

(10) Patent No.: US 12,699,148 B2
(45) Date of Patent: Aug. 4, 2026

(54) APPARATUS AND METHOD FOR INSPECTING A SECONDARY CELL

(71) Applicant: VERKOR, Grenoble (FR)

(72) Inventors: Delphine Vidal, Grenoble (FR); Drew Heilman, Grenoble (FR); Jeong Hyun Kim, Grenoble (FR)

(73) Assignee: VERKOR, Grenoble (FR)

( * ) Notice: Subject to any disclaimer, the term of this patent is extended or adjusted under 35 U.S.C. 154(b) by 0 days.

(21) Appl. No.: 18/996,279

(22) PCT Filed: Jul. 18, 2023

(86) PCT No.: PCT/FR2023/051109
§ 371 (c)(1),
(2) Date: Jan. 17, 2025

(87) PCT Pub. No.: WO2024/018150
PCT Pub. Date: Jan. 25, 2024

(65) Prior Publication Data
US 2026/0009863 A1      Jan. 8, 2026

(30) Foreign Application Priority Data

Jul. 19, 2022     (FR) ..................................... 22/07369

(51) Int. Cl.
*G01R 31/396*         (2019.01)
*G01R 31/382*         (2019.01)
*H01M 10/42*          (2006.01)

(52) U.S. Cl.
CPC ......... *G01R 31/396* (2019.01); *G01R 31/382* (2019.01); *H01M 10/4285* (2013.01)

(58) Field of Classification Search
CPC .... G01R 31/39; G01R 31/382; H01M 10/428
(Continued)

(56) References Cited

U.S. PATENT DOCUMENTS

| | | | | |
|---|---|---|---|---|
| 5,736,835 | A * | 4/1998 | Nakajo | ................. H01M 10/48 |
| | | | | 320/112 |
| 9,000,732 | B2 * | 4/2015 | Kim | ..................... G01R 31/392 |
| | | | | 320/162 |

(Continued)

FOREIGN PATENT DOCUMENTS

| | | |
|---|---|---|
| DE | 102020005411 A1 | 11/2020 |
| EP | 2833434 A1 | 2/2015 |

(Continued)

OTHER PUBLICATIONS

European Notification under rule 71(3) EPC for Application No. 23 749 130.3, dated Jan. 7, 2025, 8 pages.

(Continued)

*Primary Examiner* — Christopher P Mcandrew
(74) *Attorney, Agent, or Firm* — CANTOR COLBURN LLP

(57) ABSTRACT

An inspection apparatus for inspecting at least one secondary cell includes a fixed support part; a movable part; pressing parts that are installed between the support part and the movable part and are freely movable along the main axis, two adjacent pressing parts defining a space for accommodating a secondary cell; and each of the pressing parts has a heat plate configured to maintain a reasonably constant temperature between the pressing parts.

13 Claims, 3 Drawing Sheets

(58) Field of Classification Search
USPC ......................................................... 324/426
See application file for complete search history.

(56) References Cited

U.S. PATENT DOCUMENTS

| | | | | |
|---|---|---|---|---|
| 10,120,032 | B2 * | 11/2018 | Akamine ................. | B60L 58/10 |
| 11,031,648 | B2 * | 6/2021 | Gu ......................... | H01M 50/30 |
| 11,038,212 | B2 * | 6/2021 | Jung ....................... | B60L 58/12 |
| 2003/0117105 | A1 * | 6/2003 | Davis ................. | H01M 10/441 |
| | | | | 320/107 |
| 2010/0052616 | A1 * | 3/2010 | Takada ............. | H01M 10/4207 |
| | | | | 320/150 |
| 2011/0097614 | A1 * | 4/2011 | Kim .................... | H01M 10/613 |
| | | | | 429/120 |
| 2018/0269547 | A1 * | 9/2018 | Robert ............. | H01M 10/6554 |
| 2020/0150061 | A1 * | 5/2020 | Kriele ............. | G01N 23/20033 |
| 2022/0065948 | A1 * | 3/2022 | Kim ................. | H01M 10/4285 |
| 2022/0181727 | A1 * | 6/2022 | Park .................... | H01M 50/242 |
| 2023/0143556 | A1 * | 5/2023 | Lee ..................... | H01M 50/244 |
| 2024/0283103 | A1 * | 8/2024 | Kim .................... | H01M 50/533 |

FOREIGN PATENT DOCUMENTS

| | | | |
|---|---|---|---|
| EP | 3415938 | A1 | 12/2018 |
| EP | 3428670 | A1 | 1/2019 |
| EP | 3683589 | A1 | 7/2020 |
| KR | 20200059483 | A | 5/2020 |
| KR | 20210120294 | A | 10/2021 |

OTHER PUBLICATIONS

International Search Report for Application No. PCT/FR2023/051109, dated Oct. 6, 2023, 2 pages.
Written Opinion for Application No. PCT/FR2023/051109, dated Oct. 6, 2023, 3 pages.

* cited by examiner

APPARATUS AND METHOD FOR INSPECTING A SECONDARY CELL

CROSS-REFERENCE TO RELATED APPLICATIONS

This application is a 35 U.S.C. § 371 National Stage patent application of PCT/FR2023/051109 filed 18 Jul. 2023, which claims the benefit of French patent application FR22/07369 filed 19 Jul. 2022, the disclosures of which are incorporated herein by reference in their entirety.

TECHNICAL FIELD

The present disclosure concerns the field of detecting defects in a secondary cell, in particular the present disclosure concerns an inspection apparatus and method for inspecting at least one secondary cell.

BACKGROUND

When manufacturing secondary cells, namely electric batteries which may be charged, discharged in an electric charge, and recharged many times, and in particular flexible bags of secondary cells, the contamination of the secondary cell is a frequently encountered problem. This contamination may be, for example, caused by a metal particle or a burr that remains on the surface of an electrode inside the secondary cell.

Indeed, in lithium-ion battery cells, the undesirable presence of contamination between two electrodes may cause an internal short circuit inside the lithium-ion battery, leading to failure, damage and, in severe cases, ignition of the battery.

This contamination is particularly difficult to detect in secondary cells. Many attempts have been made to solve this problem. For example, the document EP3415938 A1 describes a technique for detecting a low voltage defect which may occur in a secondary cell, comprising a step of assembling a secondary cell, a step of aging the assembled secondary cell, a step of charging the aged secondary cell, and a step of detecting a defect in the secondary cell. If the secondary cell has a voltage drop greater than its normal self-discharge rate, a low voltage defect is considered to occur in the secondary cell.

However, the technique described in the document EP3415938 A1 requires a considerable amount of time due to the involved long aging steps. Furthermore, the described technique does not take into account the influence of temperature variation on the measured parameters.

The present disclosure provides an apparatus and method to inspect accurately, easily and quickly whether a contaminant is present inside a secondary cell.

SUMMARY

To this end, the disclosure concerns an inspection apparatus for inspecting at least one secondary cell, the inspection apparatus comprising:

a fixed support element;

a movable element installed to face the support element and being movable relative to the support element along a main axis in a first direction towards the support element and a second direction opposite the first direction, each direction being along the main axis;

pressing elements installed between the support element and the movable element, said pressing elements being freely movable along the main axis, two adjacent pressing elements defining a space intended to receive a secondary cell; and a drive unit configured to operate in a first state in which the drive unit presses the at least one secondary cell which is located between two pressing elements, and a second state in which the drive unit releases the at least one secondary cell, a pressure measuring unit configured to measure the pressure applied by the drive unit;

a current control unit configured to apply a voltage to the at least one secondary cell and to measure a corresponding current through the at least one secondary cell;

wherein:

each pressing element among the pressing elements comprises a thermal plate comprises a metal stage comprising a network of thermo-regulating elements, the thermal plate being capable of maintaining a constant temperature between the pressing elements, in an operating temperature range comprised between 5° C. and 120° C.

According to one embodiment, the inspection apparatus further comprises a guide element configured to guide each pressing element to be displaced along the main axis freely in the first direction and in the second direction so as to adjust a space separating two adjacent pressing elements.

According to one characteristic, the thermal plates are coupled to a temperature regulator which controls a temperature value between two adjacent pressing elements.

According to one embodiment, the inspection apparatus further comprises a current control unit comprising:

a power source for applying a voltage to reach a predetermined voltage value relative to the at least one secondary cell pressurized by the pressing element; and a current measuring unit for measuring a current value flowing through the at least one secondary cell.

According to one embodiment, the inspection apparatus further comprises an electrode module connected to each of the electrode terminals of the at least one secondary cell to thereby apply or receive current.

According to one embodiment, the inspection apparatus further comprises a controller which is connected to the pressure drive unit, the electrode module and the current control unit, respectively, to control the operations of pressurizing and releasing the drive unit, and to determine whether or not there is a defect in the at least one secondary cell by comparing the current value measured by the current control unit and a reference current value.

According to one embodiment, the inspection apparatus comprises a frame intended to be installed on a support, the support element being installed so as to be perpendicular to the frame, the frame comprising a chassis resting on the ground and a pair of support frames provided on either side of the chassis to face each other, and wherein:

the pressure measuring unit comprises a pressure sensor interposed between a fixed element fastened to face the support element and the support frame provided on one side of the chassis, the pressure sensor being configured to measure a pressure when the pressing elements pressurize the at least one secondary cell when the drive unit is in its first operating state.

According to one embodiment, the pressure measuring unit comprises a pressure sensor comprised between two adjacent pressing elements among the pressing elements.

According to one characteristic, the space is intended to receive a single secondary cell.

According to one embodiment, the movable element is movable in translation in the first direction and the second direction, between a first position corresponding to the first state and a second position corresponding to the second state.

The disclosure further concerns an inspection method for inspecting at least one secondary cell, the inspection method comprising the following steps:

providing the inspection apparatus as previously described;

providing the at least one secondary cell to be inspected;

introducing the at least one secondary cell into the inspection apparatus such that the at least one secondary cell is introduced between two adjacent pressing elements;

pressurizing and releasing the at least one secondary cell between the pressing elements on both sides by displacing the movable element relative to the support element along a main axis in a first direction and a second direction opposite each other;

maintaining a constant temperature between the pressing elements using the thermal plates comprised in the pressing elements;

measuring the pressure applied to the at least one secondary cell using the pressure measuring unit in order to determine whether the applied pressure is within a predefined pressure range;

applying a voltage to the at least one secondary cell and measuring a corresponding current through the at least one secondary cell.

According to one characteristic of the inspection method, the inspection method further comprises the following steps:

comparing the measured current value with a reference current value;

sorting the at least one secondary cell as functional or defective based on the comparison between the measured current value and the reference current value such that:

if the measured current value exceeds the reference current value, the at least one secondary cell is considered defective, if the measured current value is lower than the reference current value, the at least one secondary cell is considered functional.

According to one embodiment, the step consisting of providing the at least one secondary cell comprises the following sub-steps:

assembling a first electrode and a second electrode and a separator interposed between the first electrode and the second electrode in order to create a bobbin or a stack;

placing the bobbin or the stack in a package or a flexible bag;

filling the package or the bag with an electrolyte;

hermetically sealing the package or the bag in order to obtain at least one secondary cell;

charging the at least one secondary cell to a predetermined state of charge in order to form a solid electrolyte interphase on the surface of the first electrode before placing the at least one secondary cell in the inspection apparatus.

Other advantages and features will become apparent in the detailed description that follows.

BRIEF DESCRIPTION OF THE DRAWINGS

The disclosure will now be described, only by way of example, with reference to the accompanying figures, in which.

In these figures, the same reference numerals are used to designate the same elements.

For reasons of clarity, the figures are not necessarily reproduced to scale.

DETAILED DESCRIPTION OF THE DRAWINGS

The disclosure concerns an inspection apparatus 1 for inspecting at least one secondary cell 110 which may be a bagged cell for example.

Figure 1:
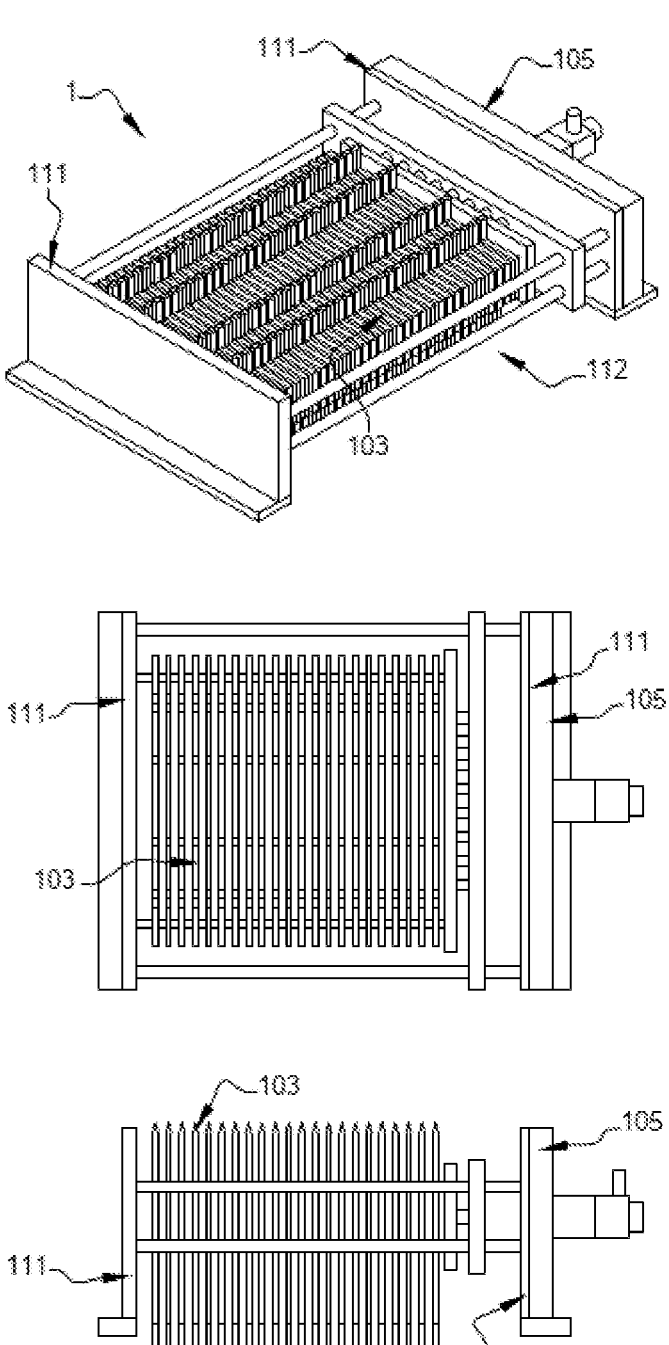
FIG. 1 is a perspective view, a top view and a side view of an inspection apparatus according to the disclosure.
Figure 2:
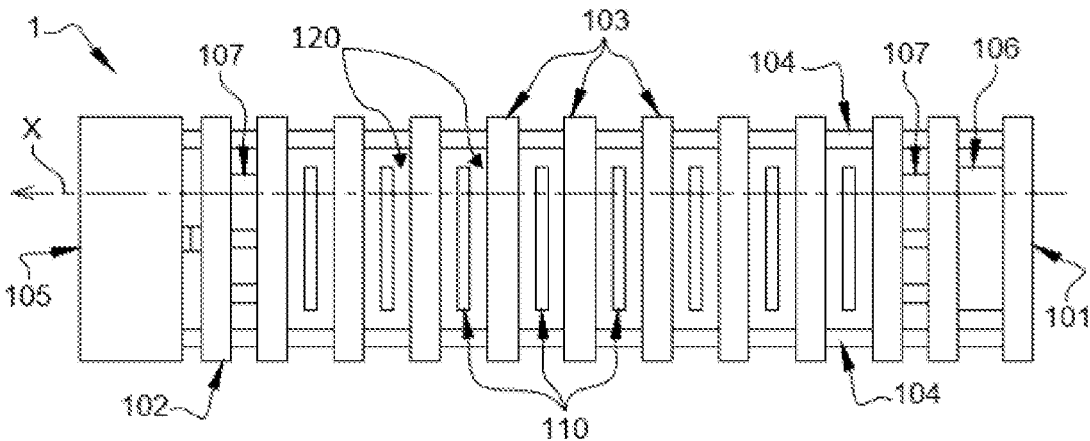
FIG. 2 is a cross-sectional view of the inspection apparatus according to FIG. 1.

The inspection apparatus 1 is presented in FIG. 1 and FIG. 2 and comprises a fixed support element 101.

The support element 101 may be installed so as to be perpendicular to a frame intended to be installed on a support, and the frame may comprise a chassis 112 resting on the ground and a pair of support frames 111 provided on either side of the chassis 112 to face each other.

The inspection apparatus 1 also comprises a movable element 102 installed to face the support element 101 and which is movable relative to the support element 101 along a main axis X in a first direction towards the support element 101 and a second direction opposite the first direction, each direction being along the main axis X.

The first direction is defined as the direction in which the movable element 102 approaches the support element 101 and the second direction is defined as the direction in which the movable element 102 moves away from the support element 101.

The inspection apparatus also comprises pressing elements 103 installed between the support element 101 and the movable element 102 and freely movable along the main axis X. Two adjacent pressing elements 103 define a space 120 intended to receive only a secondary cell 110.

The space 120 is intended to receive a single secondary cell 110. By receiving only a single secondary cell, it is possible to perform precise measurements on the cell 110.

The pressing elements 103 may in particular be pressing panels which may be installed in parallel between the support element 101 and the movable element 102.

The inspection apparatus 1 also comprises:

a guide element 104 configured to guide each pressing element 103 so that it is displaced along the main axis X freely in the first direction and in the second direction so as to adjust a space separating two adjacent pressing elements 103; and a drive unit 105 configured to operate in a first state in which the drive unit 105 presses the at least one secondary cell 110 which is located between the pressing elements 103 on both sides, and in a second state in which the drive unit 105 releases the at least one secondary cell 110, a change of operation between the first state and the second state being obtained by displacing the movable element 102 in the first direction and in the second direction;

a pressure measuring unit configured to measure the pressure applied by the drive unit 105.

Advantageously, the guide element 104 makes it possible to obtain substantially parallel plates, making it possible to obtain usable pressure measurements.

According to one embodiment, the pressure measuring unit comprises a pressure sensor 106 interposed between a fixed element fastened to face the support element 101 and the support frame provided on one side of the chassis 112, and the pressure sensor 106 may be configured to measure a pressure when the pressing elements 103 pressurize the at least one secondary cell 110 when the drive unit 105 is in its first operating state.

According to one embodiment, the pressure measuring unit comprises a pressure sensor comprised between two adjacent pressing elements among the pressing elements 103, and the pressure sensor 106 may comprise a charge cell, a strain gauge, a force-sensitive resistor or a combination of all the cited pressure sensors.

The inspection apparatus 1 may further comprise an elastic support unit configured to elastically support the support element 101 to be brought back to the pressing element side, wherein the elastic support unit may comprise a fixed element fastened to face the support element 101 and a compression spring 107 introduced into the guide element 104 so as to be positioned between the fixed element and the support element 101.

Figure 3:
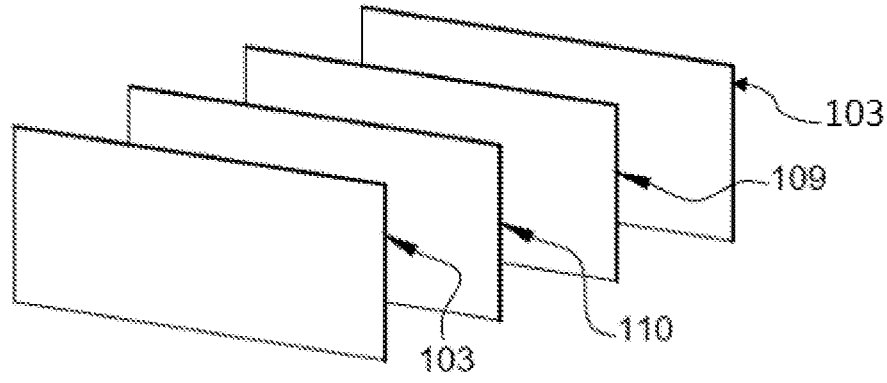
FIG. 3 is an exploded view showing the interior of a pressing element comprised in the inspection apparatus and configured to pressurize at least one secondary cell.

The inspection apparatus is remarkable in that each pressing element among the pressing elements 103 comprises a thermal plate 109 as may be seen in FIG. 3. The thermal plate is configured to maintain a reasonably constant temperature between the pressing elements 103. In other words, the thermal plate is capable of maintaining a constant temperature between the pressing elements.

The thermal plates advantageously make it possible to obtain reliable and good quality current measurement. Indeed; the temperature of the surrounding environment does not influence the current measurements. We can therefore do without a step of correcting the current measurements, this correction step usually being carried out by calculations taking into account a temperature value.

The thermal plates take the form of a metal stage in which a network of thermo-regulating elements extends. These thermo-regulating elements may be of the electric type or of the heat transfer fluid type.

By "reasonably constant" we mean that the temperature has a constant value of plus or minus 1° C.

The dimensions of each thermal plate 109 may be at least equal to the dimensions of the secondary cell or greater.

The thermal plates 109 can be coupled to a temperature regulator which controls a temperature value between two adjacent pressing elements 103.

The temperature regulator may be used to set a temperature value with an accuracy of less than or equal to 0.1° C.

The thermal plates 109 have an operating temperature range comprised between 5° C. and 120° C. In practice, the user can choose the reasonably constant temperature value in a temperature range comprised between 5° C. and 120° C., with an accuracy of plus or minus 0.1° C. An operating temperature within this temperature range allows reliable current measurements to be obtained while ensuring the physical and chemical integrity of the cells.

Advantageously, this operating temperature range is adapted to the operating conditions of the inspection apparatus 1.

The pressing elements 103 may each comprise a pressing pad fastened to one or both sides of each pressing element 103 in order to effectively pressurize the at least one secondary cell 110, and the pressing pad may comprise a silicone pad and an insulating paper.

The silicone pad is intended to prevent damage to the cell and the insulating paper is intended to prevent the short circuits.

The inspection apparatus 1 further comprises a current control unit configured to apply a voltage to the at least one secondary cell 110 and to measure a corresponding current through the at least one secondary cell 110.

The current control unit may comprise:

a power source for applying a voltage to reach a predetermined voltage value relative to the at least one secondary cell 110 pressurized by the pressing elements 103; and a current measuring unit for measuring a current value flowing through the at least one secondary cell 110.

Advantageously, the current control unit performs a control of the current of the at least one pressurized secondary cell 110, which makes it possible to measure the current flowing through the at least one secondary cell 110.

The current control unit applies a predetermined voltage to the at least one secondary cell 110, and measures the current of the at least one secondary cell 110.

The inspection apparatus 1 may further comprise an electrode module connected to each of the electrode terminals of the at least one secondary cell 110 to thereby apply or receive current.

The inspection apparatus 1 may further comprise a controller which is connected to the drive unit 105, the electrode module and the current control unit, respectively, to control the operations of pressurizing and releasing the drive unit 105, and to determine whether or not there is a defect in the at least one secondary cell 110 by comparing the measured current value given by the current control unit and a reference current value.

The controller may determine whether there is a defect by comparing an average value of the current values measured by the current control unit with the reference value for a predetermined time period which may depend on the user-controlled parameters of the inspection apparatus.

The predetermined time period may be from 1 to 30 seconds.

The reference current value may be determined from an experiment, for example by referring to a calibration curve or an abacus which shows whether the at least one secondary cell 110 is defective or not depending on the measured current value.

The inspection apparatus 1 may allow the inspection of many secondary cells 110 simultaneously.

Figure 4:
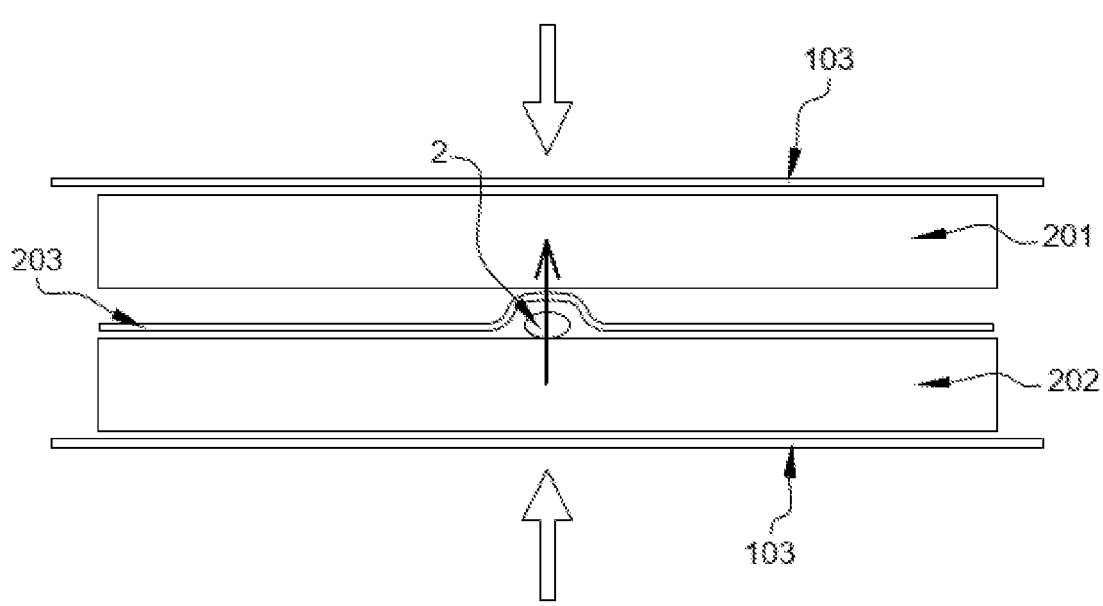
FIG. 4 is a schematic view of the interior of at least one secondary cell which is pressurized within the inspection apparatus.

The inspection apparatus 1 is intended to pressurize the at least one secondary cell 110 to allow or improve a physical contact between the first electrode 201 and the second electrode 202 across the contaminant 2 in order to induce an electric current which flows through the contaminant 2 between the first electrode 201 and the second electrode 202. As can be seen in FIG. 4, the pressure applied to the at least one secondary cell 110 improves the detection of a potential contaminant 2 inside the at least one secondary cell 110; the current flowing through the contaminant 2 is therefore easier to detect.

The first electrode 201 may be a cathode and the second electrode 202 may be an anode or vice versa.

The operation of the inspection apparatus 1 will now be described.

When the at least one secondary cell 110 is introduced into the inspection apparatus 1, the movable element 102, installed to face the support element 101, is displaced in the first direction and in the second direction along the main axis X by the drive unit 105 to pressurize and depressurize the pressing elements 103.

The movable element 102 is displaced in the first direction along the main axis X in order to pressurize the at least one secondary cell 110. A predetermined potential is applied to the cell and the current in the at least one secondary cell 110 is then measured and the movable element 102 is displaced in the second direction along the main axis X after the measurement of the current in order to release the at least one secondary cell 110.

The movable element 102 is movable in translation in the first direction and the second direction, between a first position and a second position. The first position corresponds to the first state in which the cells are pressed by the drive unit 105, and the second position corresponds to the second state in which the cells are released by the drive unit 105.

The pressing elements 103 pressurize the body part of the at least one secondary cell 110. Here, the body part refers to the body part of the at least one secondary cell 110, with the exception of the electrode terminal of the at least one secondary cell 110.

When the pressing elements 103 pressurize the at least one secondary cell 110, the pressure measuring unit may be interposed between the fixed element and the support frame to measure the pressure.

If the pressure applied to the at least one secondary cell 110 is too high, the electrode may be detached or the appearance of the at least one secondary cell 110 may be damaged. On the contrary, if the pressure is too low, the first electrode 201 and the second electrode 202 may not be physically in contact with each other through the contaminant 2, so that an internal short circuit may not be triggered, which decreases the reliability of the detection of the defects. Thus, by detecting the pressure applied to the at least one secondary cell 110 through the pressure sensor 106, it is possible to check whether an appropriate level of pressure is applied.

A voltage is then applied by the current control unit in order to perform a current control of the at least one pressurized secondary cell 110. To this end, the power source comprised in the current control unit applies a voltage across the electrode module in order to reach a predetermined voltage value, and the current measuring unit measures the value of the current flowing through the at least one secondary cell 110.

The current control unit and the electrode module may be electrically linked by a cable, or any other electrical connection means.

The electrode module electrically links the current control unit to the at least one secondary cell 110. The electrode module may be fastened to the inspection apparatus 1. The electrode module is connected to each electrode terminals of the at least one secondary cell 110 and applies the current applied by the current control unit to the at least one secondary cell 110, or transfers the current from the at least one secondary cell 110 to the current control unit.

As the measured current is sensitive to the temperature variations, the thermal plates 109 act to maintain a reasonably constant temperature between the pressing elements 103. This allows the current value to be measured more accurately and avoids sorting errors.

Then, the controller which is connected to the drive unit 105, the electrode module and the current control unit, compares the current value measured by the current control unit and the reference current value in order to determine whether or not there is a defect. Furthermore, the controller may compare the current value of the at least one secondary cell 110 measured by the current control unit with a predetermined reference value of a good product and determines whether the value is acceptable according to the predetermined criteria. The result of the determination may be displayed by a display unit not represented.

The controller therefore determines whether the at least one secondary cell 110 is good or not depending on whether the value measured according to of the measured electricity quantity or the insulation degree corresponds to a predetermined standard and may allow the display unit or a data output device to display the result of the determination for at least one secondary cell 110.

These values may vary depending on feedback and data collection, after production and inspection of a certain number of secondary cells.

The disclosure also concerns an inspection method for inspecting at least one secondary cell 110.

The inspection method comprises a step consisting of providing an inspection apparatus 1 as described above and a step consisting of providing the at least one secondary cell 110 to be inspected.

In order to provide the at least one secondary cell 110 to be inspected, the following sub-steps may be executed:

assembling at least the first electrode 201 and the second electrode 202 and a separator 203 interposed between the first electrode 201 and the second electrode 202 in order to create a bobbin or a stack;

placing the bobbin or the stack in a package or a flexible bag;

filling the package or the bag with an electrolyte;

hermetically sealing the package or the bag in order to obtain the at least one secondary cell 110;

charging the at least one secondary cell 110 to a predetermined state of charge in order to form a solid electrolyte interphase on the surface of the first electrode 201 before placing the at least one secondary cell 110 in the inspection apparatus.

According to one possibility, a bobbin or a stack may be created by assembling many first electrodes, many second electrodes, many separators and other additional layers.

Then, once the inspection apparatus 1 and the at least one secondary cell 110 to be inspected are provided, the following steps are executed:

introducing the at least one secondary cell 110 into the inspection apparatus 1 such that the at least one secondary cell 110 is introduced between two adjacent pressing elements 103;

pressurizing and releasing the at least one secondary cell 110 between the pressing elements 103 on both sides by displacing the movable element 102 relative to the support element 101 along a main axis X in the first direction and the second direction opposite to each other along the main axis X;

maintaining a reasonably constant temperature between the pressing elements 103 using the thermal plates 109 comprised in the pressing elements 103;

measuring the pressure applied to the at least one secondary cell 110 using the pressure measuring unit in order to determine whether the applied pressure is within a predefined pressure range which may be comprised between 200 and 5000 kgf/cm²;

applying a voltage to the at least one secondary cell 110 and measuring a corresponding current through the at least one secondary cell 110.

Then, in order to sort the at least one secondary cell 110 as functional or defective, the following steps may be executed:

comparing the measured current value with the reference current value which may be defined from an experiment;

sorting the at least one secondary cell 110 as functional or defective based on the comparison between the measured current value and the reference current value such that:

if the measured current value exceeds the reference current value, the at least one secondary cell 110 is considered defective, if the measured current value is lower than the reference current value, the at least one secondary cell 110 is considered functional.

The pressure sensor makes it possible to check whether the applied pressure value is appropriate or not.

Advantageously, the described inspection method makes it possible to maintain a reasonably constant temperature inside the inspection apparatus 1 thanks to the use of thermal plates 109 comprised in the pressing elements 103.

The measured current flowing through the secondary cell depends on the temperature and will therefore be measured more accurately using the described inspection method.

The described inspection method allows more precise sorting of the at least one inspected secondary cell 110.

Advantageously, the inspection method may be applied during a process for manufacturing the at least one secondary cell 110 after an electrolyte impregnation phase, and before a first charge of the at least one secondary cell 110.

Advantageously, the inspection method may be applied after the formation of the cell.

The inspection method and apparatus described above have an industrial application in the field of manufacturing secondary cells.

What applies in this detailed description to the inspection method also applies to the inspection apparatus, and vice versa.

The invention claimed is:

1. An inspection apparatus for inspecting at least one secondary cell, the inspection apparatus comprising:

a fixed support element;

a movable element installed to face the support element and being movable relative to the support element along a main axis in a first direction towards the support element and a second direction opposite the first direction, each direction being along the main axis;

pressing elements installed between the support element and the movable element, said pressing elements being freely movable along the main axis, two adjacent pressing elements defining a space intended to receive a secondary cell;

and a drive unit configured to operate in:

a first state in which the drive unit presses the at least one secondary cell which is located between the pressing elements on both sides, and a second state in which the drive unit releases the at least one secondary cell, a pressure measuring unit configured to measure the pressure applied by the drive unit;

a current control unit configured to apply a voltage to the at least one secondary cell and to measure a corresponding current through the at least one secondary cell;

wherein:

each pressing element among the pressing elements comprises a thermal plate comprising a metal stage comprising a network of thermo-regulating elements, the thermal plate being capable of maintaining a constant temperature between the pressing elements in an operating temperature range comprised between 5° C. and 120° C.

2. The inspection apparatus according to claim 1, further comprising:

a guide element configured to guide each pressing element to be displaced along the main axis freely in the first direction and in the second direction so as to adjust the space separating two adjacent pressing elements.

3. The inspection apparatus according to claim 1, wherein the thermal plates are coupled to a temperature regulator which controls a temperature value between two adjacent pressing elements.

4. The inspection apparatus according to claim 1, wherein the current control unit comprises:

a power source for applying a voltage to reach a predetermined voltage value relative to the at least one secondary cell pressurized by the pressing elements; and a current measuring unit for measuring a current value flowing through the at least one secondary cell.

5. The inspection apparatus according to claim 1, further comprising an electrode module connected to each of the electrode terminals of the at least one secondary cell to thereby apply or receive current.

6. The inspection apparatus according to claim 4, further comprising a controller which is connected to the drive unit, the electrode module and the current control unit, respectively, to control the operations of pressurizing and releasing the drive unit, and to determine whether or not there is a defect in the at least one secondary cell by comparing the measured current value given by the current monitoring unit and a reference current value.

7. The inspection apparatus according to claim 1, comprising a frame intended to be installed on a support, the support element being installed so as to be perpendicular to the frame, the frame comprising a chassis resting on the ground and a pair of support frames provided on either side of the chassis to face each other, and wherein:

the pressure measuring unit comprises a pressure sensor interposed between a fixed element fastened to face the support element and the support frame provided on one side of the chassis, the pressure sensor being configured for measuring a pressure when the pressing elements pressurize the at least one secondary cell when the drive unit is in its first operating state.

8. The inspection apparatus according to claim 1, wherein the pressure measuring unit comprises a pressure sensor comprised between two adjacent pressing elements among the pressing elements.

9. The inspection apparatus according to claim 1, wherein the space is intended to receive a single secondary cell.

10. The inspection apparatus according to claim 1, wherein the movable element is movable in translation in the first direction and the second direction, between a first position corresponding to the first state and a second position corresponding to the second state.

11. An inspection method for inspecting at least one secondary cell, the inspection method comprising the following steps:

providing an inspection apparatus according to claim 1;

providing the at least one secondary cell to be inspected;

introducing the at least one secondary cell into the inspection apparatus such that the at least one secondary cell is introduced between two adjacent pressing elements;

pressurizing and releasing the at least one secondary cell between the pressing elements on both sides by displacing the movable element relative to the support element along a main axis in a first direction and a second direction opposite each other along the main axis;

maintaining a constant temperature between the pressing elements using the thermal plates comprised in the pressing elements;

measuring the pressure applied to the at least one secondary cell using the pressure measuring unit in order to determine whether the applied pressure is within a predefined pressure range;

applying a voltage to the at least one secondary cell and measuring a corresponding current through the at least one secondary cell.

12. The inspection method according to claim 11 further comprising the following steps:

comparing the measured current value with a reference current value;

sorting the at least one secondary cell as functional or defective based on the comparison between the measured current value and the reference current value such that:

if the measured current value exceeds the reference current value, the at least one secondary cell is considered defective, if the measured current value is lower than the reference current value, the at least one secondary cell is considered functional.

13. The inspection method according to claim 11, wherein the step including providing the at least one secondary cell further includes the following sub-steps:

assembling a first electrode and a second electrode and a separator interposed between the first electrode and the second electrode in order to create a bobbin or a stack;

placing the bobbin or the stack in a package or a flexible bag;

filling the package or the bag with an electrolyte;

hermetically sealing the package or the bag in order to obtain the at least one secondary cell; and charging the at least one secondary cell to a predetermined state of charge in order to form a solid electrolyte interphase on the surface of the first electrode before placing the at least one secondary cell in the inspection apparatus.

* * * * *